United States Patent
Reath Bennett et al.

(10) Patent No.: US 6,187,511 B1
(45) Date of Patent: Feb. 13, 2001

(54) WATER-LESS LITHOGRAPHIC PLATES

(75) Inventors: Peter Andrew Reath Bennett, N. Yorks; Carole-Anne Smith, Edinburgh, both of (GB)

(73) Assignee: Kodak Polychrome Graphics LLC, Norwalk, CT (US)

( * ) Notice: Under 35 U.S.C. 154(b), the term of this patent shall be extended for 0 days.

(21) Appl. No.: 09/011,436

(22) PCT Filed: Aug. 13, 1996

(86) PCT No.: PCT/GB96/01974

§ 371 Date: Feb. 11, 1998

§ 102(e) Date: Feb. 11, 1998

(87) PCT Pub. No.: WO97/07430

PCT Pub. Date: Feb. 27, 1997

(30) Foreign Application Priority Data

Aug. 15, 1995 (GB) .................................. 9516694

(51) Int. Cl.⁷ ...................................................... G03F 7/26
(52) U.S. Cl. ...................... 430/303; 430/281.1; 430/907; 430/922
(58) Field of Search ................................ 430/303, 281.1, 430/907, 922

(56) References Cited

U.S. PATENT DOCUMENTS

| | | | |
|---|---|---|---|
| 3,865,588 | * 2/1975 | Ohto et al. | 430/18 |
| 3,953,212 | 4/1976 | Miyano et al. | 96/75 |
| 4,087,584 | * 5/1978 | Taniguchi et al. | 428/422 |
| 4,508,814 | 4/1985 | Sakurai et al. | 430/303 |
| 4,510,277 | * 4/1985 | St. Clair et al. | 523/454 |
| 4,724,195 | * 2/1988 | Muller et al. | 430/192 |
| 4,874,686 | * 10/1989 | Urabe et al. | 430/272.1 |
| 5,006,443 | * 4/1991 | Muller | 430/192 |
| 5,104,961 | * 4/1992 | Muller | 528/129 |
| 5,266,443 | * 11/1993 | Higashi et al. | 430/272.1 |

FOREIGN PATENT DOCUMENTS

| | | | |
|---|---|---|---|
| 0426 470 | 5/1991 | (EP) | G03F/7/32 |
| 0 441 638 | 8/1991 | (EP) | G03F/7/105 |
| 0 512 845 | 11/1992 | (EP) | G03F/7/004 |

* cited by examiner

*Primary Examiner*—John S. Chu
(74) *Attorney, Agent, or Firm*—Ratner & Prestia

(57) ABSTRACT

There is described a method of preparing a positive working water-less lithographic plate which comprises a support having an oleophilic surface, there being coated on the support a mixture which comprises as one component an ink-repellant and water-repellant polymer or a mixture of such polymers or polymer precursors, and as the other essential component of the mixture an infra-red or heat sensitive composition selected from (a) an organic solvent soluble diazo compound and an infra-red absorbing compound, (b) a photopolymer and an infra-red absorbing dye, or (c) a mixture of a free-radically polymerisable ethylenically unsaturated compound or compounds together with either a photoinitiator which is infra-red sensitive or an initiator which is heat sensitive together with an infra-red absorbing compound, the ratio of ink-repellant polymer to infra-red or heat sensitive composition (a), (b) or (c) in the mixture being from 20–80 ink repellant polymer to 80–20 infra-red or heat sensitive composition by weight, image-wise acting on the coated mixture, developing the acted on mixture with the appropriate developing solution depending on the composition (a), (b) or (c) used, to remove the composition and the water-repellant polymer in the unacted on areas to reveal the oleophilic surface of the support in the unacted on areas of the plate and leaving the coated mixture in the acted on areas of the plate.

18 Claims, No Drawings

WATER-LESS LITHOGRAPHIC PLATES

This invention relates to the production of so-called water-less lithographic plates.

Lithographic plates may be divided into two classes. Those which require dampening water which is fed to the non-image areas of the plate, forms a water film and acts as an ink-repellant layer; this is the so-called fount solution and those which require no fount solution are called driographs or water-less lithographic plates. Most lithographic plates at present in use are of the first type and require a fount-solution during printing. However, lithographic plates of this type suffer from a number of disadvantages. Some of these are:

a) adjustment of the proper ink-water balance during press operation is difficult and requires great experience. If the correct ink-water balance is not achieved scumming is occasioned when the printed ink image extends into the non-image areas ruining the printed image.

b) adjustment of the ink-water balance at start-up or re-start up is particularly difficult and can not be stabilised until a large number of sheets have been printed, thus incurring waste, c) the ink tends to become emulsified which leads to poor adherence of the ink on to the plate which causes problems in colour reproduction and in dot reproduction, d) the printing press has to be provided with a dampening system, thus increasing its size and complexity. These dampening solutions contain volatile organic compounds.

e) The plate care chemistry and fount solutions require careful control and selection. Further plate cleaners contain significant levels of solvent which is not desirable.

However, with water-less plates in which the ink-releasing layer is, for example, a cured silicone layer there is no scumming and clearer images can be produced. Very often water-less plates comprise a base material, for example aluminium plate. on which a photosensitive layer is coated, on this photosensitive layer there is coated a silicone layer. After imagewise exposure and development in which selected areas of the photosensitive composition are altered, the overlying silicone layer is removed and the plate is inked up. The ink adheres only to those areas of the plate not covered by the silicone remaining after development. Thus the plate can be printed without the need to use a fount solution. In practice it is difficult and costly to formulate and manufacture the silicone layer composition with sufficient adhesion to the photosensitive composition in these multi-layer assemblies. Thus the only commercially available water-less lithographic plates are expensive and of complex design.

There exists in patent literature water-less lithographic plate designs which do not exhibit these disadvantages. These inventions disclose photosensitive water-less lithographic plate precursors comprising a support with an oleophilic surface and a single layer, photosensitive, ink-releasing composition such that imagewise exposure causes changes in developer solubility of the composition where development produces an ink accepting image pattern on the uncovered support surface and an ink-releasing non-image area corresponding to unremoved composition. Compositions which comprise a photosolubilising substance provide a negative working, waterless printing plate as the the unimaged area remains on the plate post-development and acts as a printing background due to the properties of the release materials. Conversely, a photoinsolubilising composition will provide for a positive working waterless printing plate.

U.S. Pat. No. 3,953,212 discloses a plate comprising a support and a coating layer of a mixture of a photosensitive material and a silicone rubber. The photosensitive materials utilised in the invention are typical of standard pre-sensitised wet, lithographic printing plates. These include photosolubilising napthoquinonediazide systems and photoinsolubilising systems including diazo compounds and photopolymer systems such as poly vinyl cinnamates and copolymers of acrylates and methacrylates.

U.S. Pat. No. 4,724,195, U.S. Pat. No. 5,006,443 and U.S. Pat. No. 5,104,961 disclose a single layer waterless plate precursor which comprises a mixture of radiation sensitive material and a class of fluorinated polymers. These fluorinated polymers represent novel release materials over U.S. Pat. No. 3,953,212. A wide range of photosolubilising and photoinsolubilising composition types which are sensitive to UV or Visible light are disclosed as useful in the invention.

EP 0,069,978 discloses a single layer photosensitive composition which comprises an emulsion polymerisation product of an acrylic or methacrylic monomer having a perfluoroalkyl group in the side chain and a photoinsolubilising photosensitive substance to provide a positive working waterless plate precursor.

The differentiation between image and non-image areas is made in the exposure process. In conventional waterless lithography a film original is applied to the plate with a vacuum to ensure good contact and the plate is then blanket exposed to a light source, a portion of which is composed of UV radiation. The aforementioned prior art all disclose this imaging process for their plate precursors.

More recent developments in the field of lithographic printing plates have provided imaging devices which allow for the preparation of direct laser written printing forms. Digital imaging information is used to image the plate directly by laser radiation without the need to utilise an imaging master such as a photographic transparency.

In addition to UV sensitivity, U.S. Pat. No. 4,724,195, U.S. Pat. No. 5,006,443 and U.S. Pat. No. 5,104,961 additionally disclose the use of visible light to image the plate, including the use of a laser emitting visible radiation. Such precursors would be imageble on commercially available laser imaging devices which use visible light, e.g 488 nm from an Argon ion laser or 532 nm from a Frequency Doubled YAG laser.

However, the imaging devices utilising such laser technology are limited commercially due to cost of the lasers used. Most recently there has been a trend to utilise lasers which emit infra-red radiation.

We have discovered a method of producing positive working waterless lithographic printing plate precursors which are imageable on exposure to infra-red radiation and/or heat and are therefore suitable for use with these new imaging systems.

According to the present invention there is provided a method of preparing a positive working water-less lithographic plate which comprises a support having an oleophilic surface, there being coated on the support a mixture which comprises as one component an ink-repellant and water-repellant polymer or a mixture of such polymers or polymer precursors, and as the other essential component of the mixture an infra-red or heat sensitive composition selected from (a) an organic solvent soluble diazo compound and an infra-red absorbing compound, (b) a photopolymer and an infra-red absorbing dye, or (c) a mixture of a free-radically polymerisable ethylenically unsaturated compound or compounds together with either a photoinitiator which is infra-red sensitive or an initiator which is heat sensitive together with an infra-red absorbing compound, the ratio of ink-repellant polymer to infra-red or heat sensitive composition (a), (b) or (c) in the mixture being from 20–80 ink repellant polymer to 80–20 infra-red or heat sensitive composition by weight, imagewise acting on the coated mixture, developing the acted on mixture with the appropriate developing solution depending on the composition (a), (b) or (c) used, to remove the composition and the water-repellant polymer in the unacted on areas to reveal the oleophilic surface of the support in the unacted on areas of the plate and leaving the coated mixture in the acted on areas of the plate.

Preferably the composition (a), (b) or (c) is imagewise exposed by a laser emitting radiation above 600 nm which is controlled by an image storage means which carries in digital form the required image.

The laser radiation absorbing compound may be carbon such as carbon black or graphite. It may be a commercially available pigment such as Heliogen Green as supplied by BASF or Nigrosine Base NG1 as supplied by MH Laboratories Inc. Usefully infra-red absorbing dyes may be of the squarylium, mercocyanine, indolizine, pyrylium or metal dithioline classes.

In one method of the present invention the composition a), b) and c) comprise a sensitiser or I.R. light absorber so enabling the composition to be photoexposed using a laser. For example an argon ion laser emits at 488 nm and a Nd YAG laser emits 1064 nm.

When the composition a), b) or c) has been sensitised to the emission wavelength of a particular laser using an I.R. sensitiser then the plate is exposed to this laser which is controlled by an image storage means which carries in digital form the required image.

Examples of suitable IR dyes are dyes of the formulae:

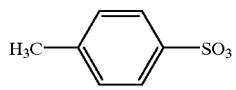

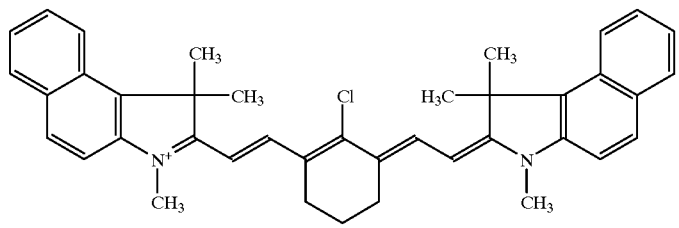

I

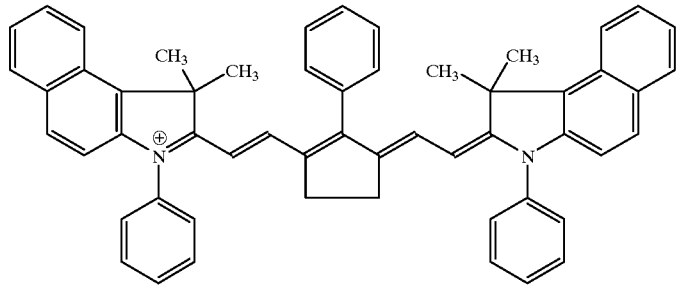

II

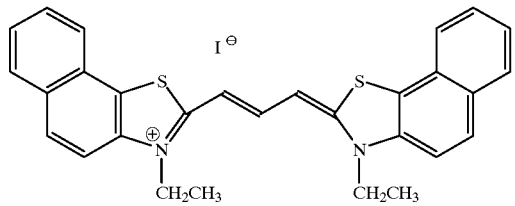

III

IV

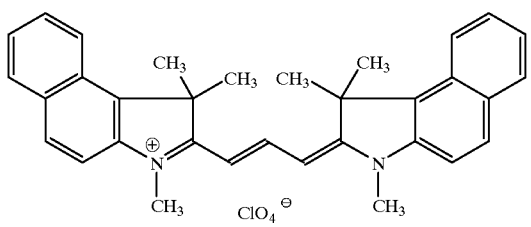

Preferably the ratio of ink-repellant and water-repellant polymer to composition (a), (b) or (c) is about 30 to 70 by weight.

The preferred water-repellant polymer is a fluorinated polymer. Preferably the fluorinated polymer is a polymerisation product of an acrylic or methacrylic monomer having a perfluoroalkyl group in a side chain. At least one other copolymerisable monomer may also be present.

Commercially available fluorine polymers or resins are available on the market as "ASAHI GUARD AG-710" (manufactured by Asahi Glass Co., Ltd), "ASAHI GUARD AG-550" (manufactured by Asahi Glass Co. Ltd), "DICGURARD F-60" (manufactured by Dainippon Ink and Chemicals, Inc.). "DICGURARD F-70" (manufactured by Dainippon Ink and Chemicals, Inc.) "SCOTCH GUARD FC-282" (manufactured by Sumitomo 3M). "ZEPEL B" (manufactured by E. I. DuPont). Examples of the perfluoroalkyl-bearing monomer are (perfluorononyl)ethyl acrylate, (perfluorononyl)ethyl methacrylate, (perfluoroisononyl)ethyl acrylate, (perfluoroisononyl)ethyl methacrylate, (perflurooctyl)ethyl acrylate, (perfluorooctyl)ethyl methacrylate, (perfluoroheptyl)ethyl acrylate. (perfluoroheptyl(ethyl methacrylate, etc. Examples of the other copolymerisable monomer which may be present include styrene, acrylonitrile, acrylic acid and methacrylic acid, and their esters such as alkyl esters (e.g. methyl ester, ethyl ester, propyl ester, butyl ester, isobutyl ester, 2-ethylhexyl ester, hexyl ester, decyl ester, lauryl ester, stearyl ester), hydroxyalkyl esters (e.g. B-hydroxyethyl ester) and glycidyl ester. The proportion of these monomers may be optionally selected, but the amount of the perfluoroalkyl-bearing monomer should be not less than 50% by weight on the basis of the amount of the entire monomers.

These fluorine resins are described in U.S. Pat. No. 4,508,814 to Nippon Paint which describes a process wherein a water-soluble photosensitive compound is used to prepare either a negative working plate or a positive working plate.

Other suitable fluorine resins are described in U.S. Pat. No. 4,087,584 and in U.S. Pat. No. 4,724,195.

Suitable silicones for use in the present invention are described in for example U.S. Pat. No. 4,510,277, U.S. Pat. No. 3,865,588, U.S. Pat. No. 5,266,443 and U.S. Pat. No. 4,874,686.

Examples of useful silicone polymers are organo functional siloxanes. One such siloxane is available from Dow Corning as a 40% solids emulsion under the designation SYL OFF 7920.

By ink-repellant and water-repellant polymer precursor is meant a silicone or fluorine containing oligomer or monomer which is converted to an ink-repellant and water-repellant polymer in-situ in the plate by the presence of an initiating species for example an Irgacure 369 or 907 which are marketed by Ciba-Geigy A.G.

Usefully a curing catalyst may be used in conjunction with the silicone polymer. For example, a platinum based catalyst marketed by Dow Coming under the designation SYL OFF 7922 may be used to cure SYL OFF 7920.

A mixture of fluorine resin and silicone may be used as the ink-repellant polymer. Preferably more fluorine resin than silicone is used. A suitable weight ratio is from 60% fluorine resin to 40% silicone resin.

By organic solvent soluble diazo resin is meant a resin which is soluble in organic solvents such as dimethyl formamide but is not appreciably soluble in water.

With regard to the composition (a) of use in the present invention examples of organic solvent soluble diazo resins are given in U.S. Pat. No. 4,845,009 which lists diazo monomers, suitable condensing agents and anions.

Examples of diazo monomers include 4-diazodiphenylamine, 1-diazo-4-morpholinobenzene and 1-diazo-4-N,N-benzene. Examples of condensing agents are aldehydes such as formaldehyde and benzaldehyde. Another suitable condensing agent is 4-4'bis(methoxymethyl) diphenyl ether. Examples of suitable anions are 1-naphthol-5-sulphonic acid and p-toluenesulphonic acid.

A particularly suitable solvent soluble diazo resin is marketed by PCAS of France as DSO 19. This is 4-diazo diphenylamine-formaldehyde condensate p-toluene-sulphonic acid salt.

A particularly useful developing solution for use with photosensitive composition a) comprises in water:—4.8% sodium diisopropyl naphthalene sulphonate 3.6% benzyl alcohol 2.15% sodium sulphite 1.7% trisodium citrate This is referred to hereinafter as developing solution A.

With regard to composition (b) of use in the present invention examples of water or aqueous dispersible photopolymers are dimethylmaleimide photopolymers as described in U.S. Pat. No. 4,626,497 and GB 1,544,299.

Other suitable photopolymers are cinnamates as described for example in GB 838,547, U.S. Pat. No. 3,257,664 and U.S. Pat. No. 2,690,966.

Examples of suitable sensitisers for cinnamates or dimethylmaleimide photopolymers are ketocourmarins and thioxanthones.

Water or a water-based developer is a suitable developer for photosensitive composition (b).

With regard to the composition (c) examples are free-radically polymerisable ethylenically unsaturated compounds which contain at least one ethylenically unsaturated double bond per molecule. When free-radicals are generated by an initiator these compounds polymerise to give higher molecular weight compounds which are insoluble in selected developers.

Usually a mixture of oligomers and monomers which comprise an ethylenically unsaturated moiety is employed.

Preferably such compounds comprise acrylate or methacrylate functionality.

An example of a class of oligomers with acrylate functionality is a polyester with four acrylate groups.

Commercially available compound of this class are Ebercryls which are marketed by UCB, S.A. SPECIALITIES DIVISION, DROGENBOS, BELGIUM An example of a class of monomers with acrylate functionality is dipentaerythritol penta-acrylate. Certain Ebercryl compounds also fall within this class.

Examples of suitable photoinitiators are metallocenes and in particular titanocenes are described in U.S. Pat. No. 4,590,287, U.S. Pat. No. 4,548,891 and EP 31884 assigned to Ciba-Geigy A.G.

An example of such a composition comprises

Ebercryl 140 30

Ebercryl 1290 30

Titanocene and sensitising dye 9

Made up to 16% solids with 50:50 DMF:/methoxy propanol-2-ol

The figures quoted being part by weight

A suitable developing solution for the above composition is an aqueous solution of 15% β-naphthol ethoxylate, 5% benzyl alcohol and 2% of an organic chelating agent such as nitrilotriacetic acid trisodium salt.

Other substances which may be present in any of the compositions (a), (b) or (c) include colorant dyes and surfactants.

The method of the present invention yields a positive working water-less lithographic plate in which the ink releasing composition remaining on the plate constitutes the oleophobic or ink releasing areas of the plate, whilst the areas of the plate from which the composition (a), (b) or (c) was removed by development constitutes the oleophilic areas of the plate.

After the development step and drying, the plate can be inked up. The ink is held in the areas between the portions of ink releasing composition which remain on the plate. No fount solution is required to differentiate between the oleophilic and the ink releasing areas of the plate when printing using an oleophilic printing ink. The oleophilic base used in the method of the present invention is preferably an aluminium plate which will carry on its surface a thin aluminium oxide layer due to action with atmospheric oxygen. This layer may be of increased thickness due to anodising treatment of the base. Post anodic treatment of the base to increase its oleophilicity may be undertaken. Optionally electrochemical etching may precede these processes to improve adhesion between the substrate and coating.

Alternatively or in addition the aluminium base may have been coated with a layer which gives the coated base improved oleophilicity over the uncoated base. Examples of such coatings are an oleophilic polymer for example ethyl cellulose, a resol type resin, a polychloroprene or a polyacrylonitrile-butadiene polymer.

The coating over the aluminium base plate whether treated or not may be a so-called primer layer as described for example in E.P. 44220, U.S. Pat. No. 5,061,598 and E.P. 560347. Such primer layers may comprise a large variety of polymers such as polyester, polyurethanes and polyamides and help to provide a better printing surface than is afforded by uncoated aluminium.

Another base material which may be used in the method of the present invention is a plastics material base or a treated paper base as used as a base in the photographic industry. A particularly useful plastics material base is polyethylene terephthalate which has been subbed to render its surface oleophilic. A so-called resin coated paper which has been corona discharge treated may also be used.

It is to be noted that all the radiation sensitive compositions of use in the present invention that is to say the organic solvent soluble diazo resins, the acrylic compositions and the aqueous dispersible photopolymers when used alone as the sensitive coating for a lithographic plate yield a negative image because on light or heat exposure they all harden to yield an ink-accepting image in the exposed areas. However, in the method of the present invention in all cases which ever composition (a), (b) or (c) is used a direct positive image is obtained.

Thus when the coated plate is exposed they harden and the coating remains after development. These areas are ink-repelling because of the presence of the ink-repelling polymer therein. These hardened areas do not accept ink even though they comprise a high proportion of the hardened compound which is usually ink-accepting. The unexposed areas are removed by the developer to reveal the oleophilic support and thus these areas become the image areas.

The accompanying Example will serve to illustrate the invention.

EXAMPLE 1

IR Sensitised Diazonium Salt Based System type (a):

Onto a grained and anodised, oleophilic aluminium plate a solution of the below composition was coated and then dried using hot air.

3 g of 25% Epikote 1004 (supplied by Astor-Stag Ltd) in a 9:1 methyl lactate:benzyl alcohol solvent mixture.

1.5 g of 100% DS019 diazonium salt (supplied by PCAS).

20 g of 9:1 methyl lactate:benzyl alcohol mixture.

0.2 g of 100% IR sensitiser II as hereinbefore set forth.

This was mixed until solids were dissolved and then 24.7 g of Zonyl 8070 (supplied by Du Pont Chemicals) was added and the coating mixed.

The coating was imaged by exposure to radiation from a 830 nm laser and developed using developer solution A.

On inking a positive working system was obtained.

The thus formed positive printing plates were inked-up and used on a printing press as a water-less plate requiring no fount solution. Several hundred good prints were obtained with good resolution using this plate.

What is claimed is:

1. A method of preparing a water-less lithographic plate which comprises a support having an oleophilic surface, there being coated on the support a mixture which comprises as one component an ink-repellant and water-repellant polymer or a mixture of such polymers or polymer precursors, and as the other essential component of the mixture an infra-red or heat sensitive composition selected from (a) an organic solvent soluble diazo compound and an infra-red absorbing compound, (b) a photopolymer and an infra-red absorbing dye, or (c) a mixture of a free-radically polymerisable ethylenically unsaturated compound or compounds together with either a photoinitiator which is infra-red sensitive or an initiator which is heat sensitive together with an infra-red absorbing compound, the ratio of ink-repellant polymer to infra-red or heat sensitive composition (a), (b) or (c) in the mixture being from 20–80 ink repellant polymer to 80–20 infra-red or heat sensitive composition by weight, imagewise acting on the coated mixture. developing the acted on mixture with the appropriate developing solution depending on the composition (a), (b) or (c) used, to remove the composition and the water-repellant polymer in the unacted on areas to reveal the oleophilic surface of the support in the unacted on areas of the plate and leaving the coated mixture in the acted on areas of the plate.

2. A method according to claim 1 wherein the ratio of water and ink-repellent polymer to composition (a), (b) or (c) is 30 to 70 by weight.

3. A method according to claim 1 wherein the water and ink-repellent polymer is a fluorinated resin.

4. A method according to claim 3 wherein the fluorinated resin is a polymerisation product of an acrylic or methacrylic monomer having a perfluoroalkyl group in a side chain.

5. A method according to claim 3 wherein the fluorinated resin has been formed in situ by using a fluorinated monomer.

6. A method according to claim 1 wherein the water and ink-repellent polymer is a silicone polymer.

7. A method according to claim 6 wherein the silicone polymer is an organo functional siloxane.

8. A method according to claim 7 wherein a curing catalyst is present.

9. A method according to claim 1 wherein the water and ink-repellent polymer is a mixture of a fluorinated resin and a silicone.

10. A method according to claim 1 wherein composition (a) comprises a 4-diazo-diphenylamine-formaldehyde condensate p-toluene sulphonic acid salt which is solvent soluble.

11. A method according to claim 1 wherein the free-radically polymerisable ethylenically unsaturated compounds of composition (c) are a mixture of an oligomer with acrylate functionality together and a monomer with acrylate or methacrylate functionality.

12. A method according to claim 11 wherein the oligomer with acrylate functionality is a polyester with four acrylate groups.

13. A method according to claim 11 wherein the monomer with acrylate functionality is dipentaerythritol penta-acrylate.

14. A method according to claim 1 wherein the photoinitiator in composition (c) which is present with the free radically polymerisable ethylenically unsaturated compound is a titanocene.

15. A method according to claim 1 wherein the composition (b) is a water soluble dimethylmaleimide photopolymer or a water soluble cinnamate photopolymer.

16. A method according to claim 15 wherein the dimethylmaleimide photopolymer is an acrylate backbone polymer with pendant dimethylmaleimide groups.

17. A method according to claim 15 wherein the composition (b) comprises a thiozanthone or ketocourmiarins as a sensitiser.

18. A method according to claim 1 wherein composition (a), (b) and (c) comprise an infra-red sensitising dye.

* * * * *

UNITED STATES PATENT AND TRADEMARK OFFICE
CERTIFICATE OF CORRECTION

PATENT NO.       : 6,187,511 B1
APPLICATION NO.  : 09/011436
DATED            : February 13, 2001
INVENTOR(S)      : Reath Bennett et al.

It is certified that error appears in the above-identified patent and that said Letters Patent is hereby corrected as shown below:

On page 3 of the patent, delete Structure I and insert Structure I:

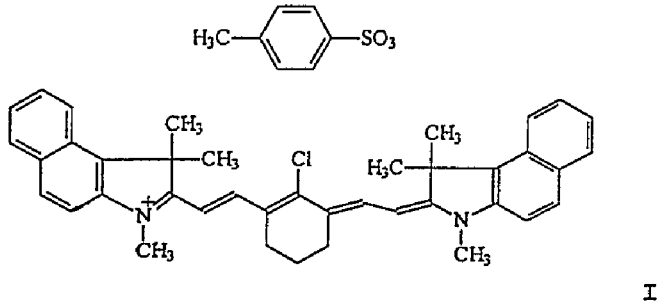

I

On page 3 of the patent, delete Structure II and insert Structure II:

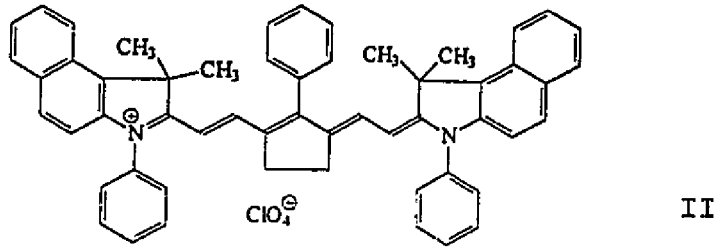

II

Column 8, line 64, delete the "." after the word "mixture" and insert a --,--

Column 10, line 23, delete "ketocourmiarins" and insert --ketocourmarins--

Signed and Sealed this

Twenty-fifth Day of September, 2007

JON W. DUDAS
*Director of the United States Patent and Trademark Office*